United States Patent [19]
Yamanaka et al.

[11] Patent Number: 5,790,439
[45] Date of Patent: Aug. 4, 1998

[54] REDUCED TEST TIME FINITE IMPULSE RESPONSE DIGITAL FILTER

[75] Inventors: Kazuya Yamanaka; Shuji Murakami; Nobuhiro Miyoshi, all of Tokyo, Japan

[73] Assignees: Mitsubishi Denki Kabushiki Kaisha; Mitsubishi Electric Engineering Co., Ltd., both of Tokyo, Japan

[21] Appl. No.: 751,165

[22] Filed: Nov. 15, 1996

[30] Foreign Application Priority Data

May 14, 1996 [JP] Japan .................... 8-119032

[51] Int. Cl.$^6$ .................................. G06F 17/10
[52] U.S. Cl. ....................... 364/724.13; 364/724.16
[58] Field of Search .................. 364/724.13, 724.16

[56] References Cited

U.S. PATENT DOCUMENTS 5,339,264  8/1994  Said et al. .................... 364/724.16
5,487,023  1/1996  Seckora .......................... 364/724.13

FOREIGN PATENT DOCUMENTS

| 2-124621 | 5/1990 | Japan . |
| 3-196712 | 8/1991 | Japan . |
| 4-266281 | 9/1992 | Japan . |
| 6-201779 | 7/1994 | Japan . |

*Primary Examiner*—Tan V. Mai
*Attorney, Agent, or Firm*—Oblon, Spivak, McClelland, Maier & Neustadt, P.C.

[57] ABSTRACT

A k-bit data input and a 1-bit scan input of a scan flip-flop ($21_i$) of a multiply-accumulation operation unit ($4_i$) respectively receive a k-bit data output and a 1-bit scan output of a scan flip-flop ($21_{i-1}$) of a multiply-accumulation operation unit ($4_{i-1}$) in the previous stage. A j-bit data input and a 1-bit scan input of a scan flip-flop ($22_j$) respectively receive a j-bit data output of an adder ($3_{i-1}$) of a multiply-accumulation operation unit ($4_{i-1}$)) in the previous stage and a 1-bit scan output of a scan flip-flop ($22_{j+1}$) in the next stage.

12 Claims, 12 Drawing Sheets

1

REDUCED TEST TIME FINITE IMPULSE RESPONSE DIGITAL FILTER

BACKGROUND OF THE INVENTION

1. Field of the Invention

The present invention relates to a digital filter, and particularly to a digital filter of a finite impulse response type circuit having operation units connected in a cascade for performing multiply-accumulation operation using multipliers and adders.

2. Description of the Background Art

Typical semiconductor integrated circuits having a multiply-accumulation operation circuit constructed using multipliers and adders include digital filters. With development of digital signal processing technology, the digital filters are increasingly replacing analogue filters in the fields of communication and people's livelihood.

FIG. 12 is a block diagram showing general structure of a digital filter 100 of a finite impulse response (FIR) type circuit having cascaded multiply-accumulation operation units (taps) performing multiply-accumulation operation. The digital filter 100 includes n multiply-accumulation operation units $15_0$-$15_{n-1}$ cascaded between first and second data inputs DATA1, DATA2 and a data output DOUT and a register (illustrated as a flip-flop in the figure) $8_n$. Each multiply-accumulation operation unit $15i$ (i=0 to n-1) includes a register $23_i$ for holding a coefficient $C_i$, a register (illustrated as a flip-flop in the figure) $8_i$ for sequentially delaying continuously inputted data, a multiplier $2_i$ for multiplying the coefficient Ci and data together, and an adder $3_i$ for providing a sum of the result of the multiplier in the previous stage and the result of the multiplier in the stage of itself to the register $8_{i+1}$ in the next stage. It performs filtering processing by obtaining $\Sigma C_i \cdot DATA1 + DATA2$.

As the digital filter is constructed as explained above, its circuit scale is determined by the number of bits of the coefficient and the data and the number of multiply-accumulation operation units.

In the recent trend toward digitization of communication, picture signal processing, sound signal processing, etc., the number of bits of coefficients and data for digital filters are increasing and the number of required taps is also steadily increasing. While such a digital filter is generally manufactured using semiconductor integrated circuit technology, test vectors and test time required to conduct a test for determining whether it is good or bad increase with an increase in circuit scale.

Considering only multipliers, for example, testing a 10 bit×10 bit multiplier without compression of test vectors requires test vectors of as many as 1024×10 24=1048576 patterns. Since a single multiply-accumulation operation unit in a digital filter includes not only a multiplier but also an adder connected in a cascade to the multiplier, a still larger number of test vectors are required. Furthermore, considering the number of multiply-accumulation operation units of the filter, an astronomical number of test vectors are required to test a digital filter.

SUMMARY OF THE INVENTION

A first aspect of the present invention is directed to a digital filter comprising a cascade connection of 0-th to (n-1)-th multiply-accumulation operation units (n: a natural number of 2 or larger). According to the present invention, in the digital filter, the 0-th multiply-accumulation operation unit includes a multiplier performing a multiplication of data to be processed by the digital filter and a 0-th coefficient, and each s-th ($1 \leq s \leq (n-1)$) multiply-accumulation operation unit includes a multiplier performing a multiplication of the data and an i-th coefficient, a scan register selectively outputting a data input which is an output of the (s-1)-th multiply-accumulation operation unit and a scan input according to a control signal on the basis of a first clock signal, and an adder performing an addition of an output of the multiplier and an output of the scan register and outputting the result to a next stage. The scan registers of the first through (n-1)-th multiply-accumulation operation units form a scan path, and a result of filtering processing to the data input is obtained from the output of the (n-1)-th multiply-accumulation operation unit.

Preferably, according to a second aspect, in the digital filter, each i-th ($0 \leq i \leq (n-1)$) multiply-accumulation operation unit further includes a shift register providing the i-th coefficient to the multiplier. The shift registers of the 0-th to (n-1)-th multiply-accumulation operation units are connected in series with each other.

Preferably, according to a third aspect, in the digital filter, the shift registers of the 0-th to (n-1)-th multiply-accumulation operation units can make input/output with the number of bits required for the i-th coefficient.

Preferably, according to a fourth aspect, in the digital filter, the shift registers of the 0-th to (n-1)-th multiply-accumulation operation units can make input/output with 1 bit, and are connected in series to each other and connected to the scan path.

Preferably, according to a fifth aspect, in the digital filter, each i-th ($0 \leq i \leq (n-1)$) multiply-accumulation operation unit further includes a register providing the i-th coefficient to the multiplier. The registers of the 0-th to (n-1)-th multiply-accumulation operation units are connected in series with each other and connected to the scan path.

Preferably, according to a sixth aspect, in the digital filter, the register of the i-th multiply-accumulation operation unit is a shift register which can make input/output with 1 bit.

Preferably, according to a seventh aspect, in the digital filter, the register of the i-th multiply-accumulation operation unit is a scan register operating on the basis of a second clock signal and serving as a component of the scan path, which selectively outputs a data input and a scan input according to the control signal, and at least the i-th coefficient is supplied as the data input to the scan register.

An eighth aspect of the present invention is directed to a digital filter comprising a cascade connection of 0-th to (n-1)-th multiply-accumulation operation units (n:a natural number of 2 or larger), wherein the 0-th multiply-accumulation operation unit includes a multiplier performing a multiplication of data to be processed by the digital filter and a 0-th coefficient. Each s-th ($1 \leq s \leq (n-1)$) multiply-accumulation operation unit includes a multiplier performing multiplication of the data and an i-th coefficient, a first selector having a first input end receiving an output of the (s-1)-th multiply-accumulation operation unit and a second input end, for selectively outputting signals applied to the first input end and the second input end according to a control signal, a first shift register transmitting an output of the first selector on the basis of a first clock signal, and an adder performing an addition of an output of the multiplier and an output of the first shift register of its own and outputting its result to a next stage. The second input ends of the first selectors of the first to (n-1)-th multiply-accumulation operation units are connected in common and supplied with first test data, and a result of filtering processing to the data input is obtained from the output of the (n-1)-th multiply-accumulation operation unit.

Preferably, according to a ninth aspect, in the digital filter, each i-th ($0 \leq i \leq (n-1)$) multiply-accumulation operation unit further includes a second shift register applying the i-th coefficient to the multiplier and operating on the basis of a second clock signal. Each s-th multiply-accumulation operation unit further includes a second selector having a first input end receiving an output of the second shift register of the (s-1)-th multiply-accumulation operation unit and a second input end for selectively outputting signals applied to the first input end and the second input end according to the control signal, wherein the second input ends of the second selectors of the first to (n-1)-th multiply-accumulation operation units are connected in common and supplied with second test data.

Preferably, according to a tenth aspect, the digital filter grasps the output of the (n-1)-th multiply-accumulation operation unit collectively for every certain bits as output groups, wherein whether the digital filter is good or bad is determined according to agreement/disagreement of the output groups adjacently outputted.

According to the digital filter of the first, second, fifth and seventh aspects of the present invention, since it is possible to separately apply test with the same contents at the same time to each multiply-accumulation operation unit, the test can be conducted with reduced test vectors and test time.

According to the digital filter of the third aspect, test for the registers holding coefficients multiplied to data subjected to filter processing by the digital filter can be conducted separately from test to the multipliers and adders. Furthermore, it does not require a long time to store the coefficients for multiplication in the shift registers.

According to the digital filter of the fourth and sixth aspects of the invention, a test with suppressed test vectors can be realized with a simple structure. It can be applied also to the case where data applied as coefficient from an external interface is of serial type.

According to the digital filter of the eighth aspect of the present invention, the first test data for test of multiply-accumulation operation can be supplied to the first shift registers all at once in respective multiply-accumulation operation units through the first selectors. Hence, the time required to store the first test data can be reduced and tests with the same contents can be conducted at the same time separately for each multiply-accumulation operation unit with reduced test vectors in a reduced test time.

According to the digital filter of the ninth aspect, the second test data for testing the registers holding coefficients used in multiplication can be provided to the second shift registers all at once in respective multiply-accumulation operation units through the second selectors. Hence, the time required for storage of the second test data is reduced and the test of the registers holding the coefficients can be made separately from, and in parallel with, the test for multiply-accumulation operation.

According to the digital filter of the tenth aspect of the present invention, it can be determined whether the digital filter is good or bad without requiring large-scale test apparatus and test vectors.

The present invention has been made to solve the problems described above, and it is an object of the present invention to provide technique which enables a test of a digital filter with a smaller number of test vectors.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Invention:

Before describing a first invention of this application in detail, a scan path as its background technology will be described.

Figure 13:
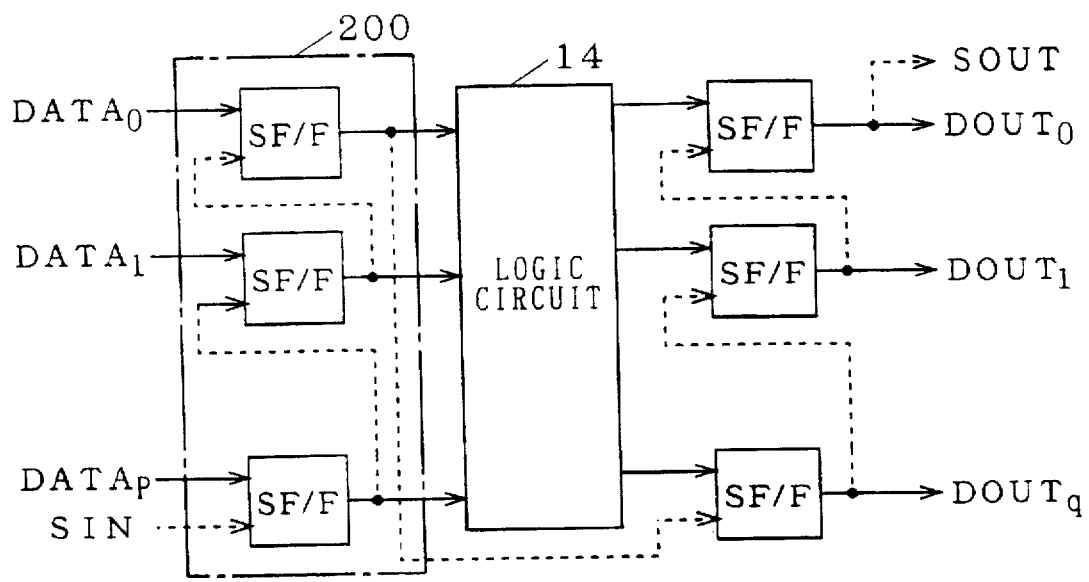
FIG. 13 is a block diagram illustrating a scan path.

Conventionally, insertion of a scan path has been made as a method of testing LSIs. FIG. 13 is a block diagram showing an example of insertion of a scan path. The route shown by the broken lines in the figure is the scan path. Herein, note that the interconnections shown by broken lines are also actually provided interconnections. The broken lines are used only to show that those are scan paths, which are the same as interconnections shown by solid lines in other respects.

The (p+1) data $DATA_0$-$DATA_p$ are provided as inputs to a logic circuit 14 and the data $DOUT_0$-$DOUT_q$ are provided as outputs from the logic circuit 14. Scan registers (shown as scan flip-flops in the figure) are interposed between inputs and outputs of the data (in the data paths).

Figure 14:
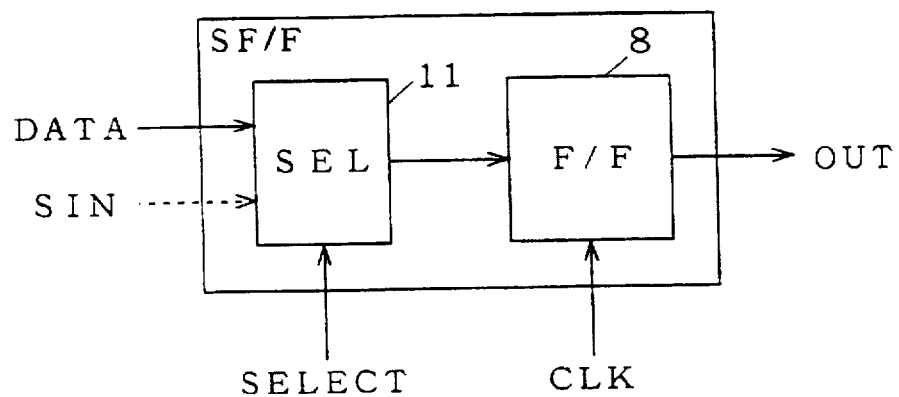
FIG. 14 is a block diagram illustrating the structure of the scan register.

FIG. 14 is a block diagram showing the structure of the scan register. The scan register has two inputs, a data input and a scan input, which are applied by a selector 11 to a flip-flop 8 in an alternative way on the basis of a control signal SELECT. The flip-flop 8 outputs its hold content in synchronization with a clock signal CLK.

An output of a scan register becomes a scan input to an adjacent scan register, the scan registers being connected in series to form the scan path from a scan-in signal SIN to a scan-out signal SOUT. Although not shown in FIG. 13, it is possible by switching the control signal to use the scan registers as ordinary registers in normal operation of the circuit and to form the scan path in test. The scan path allows a register in an arbitrary position to be set to an arbitrary value in testing and also allows values of the registers after operation to be directly observed, providing the effect of enabling easy production of test vectors and expected values.

According to the first invention of this application, a scan register is provided for each multiply-accumulation operation unit with a scan path passing through all the multiply-accumulation operation units so that a test can be conducted with a small number of test vectors. Now, it will be described in detail in each preferred embodiment.

First Preferred Embodiment.

Figure 1:
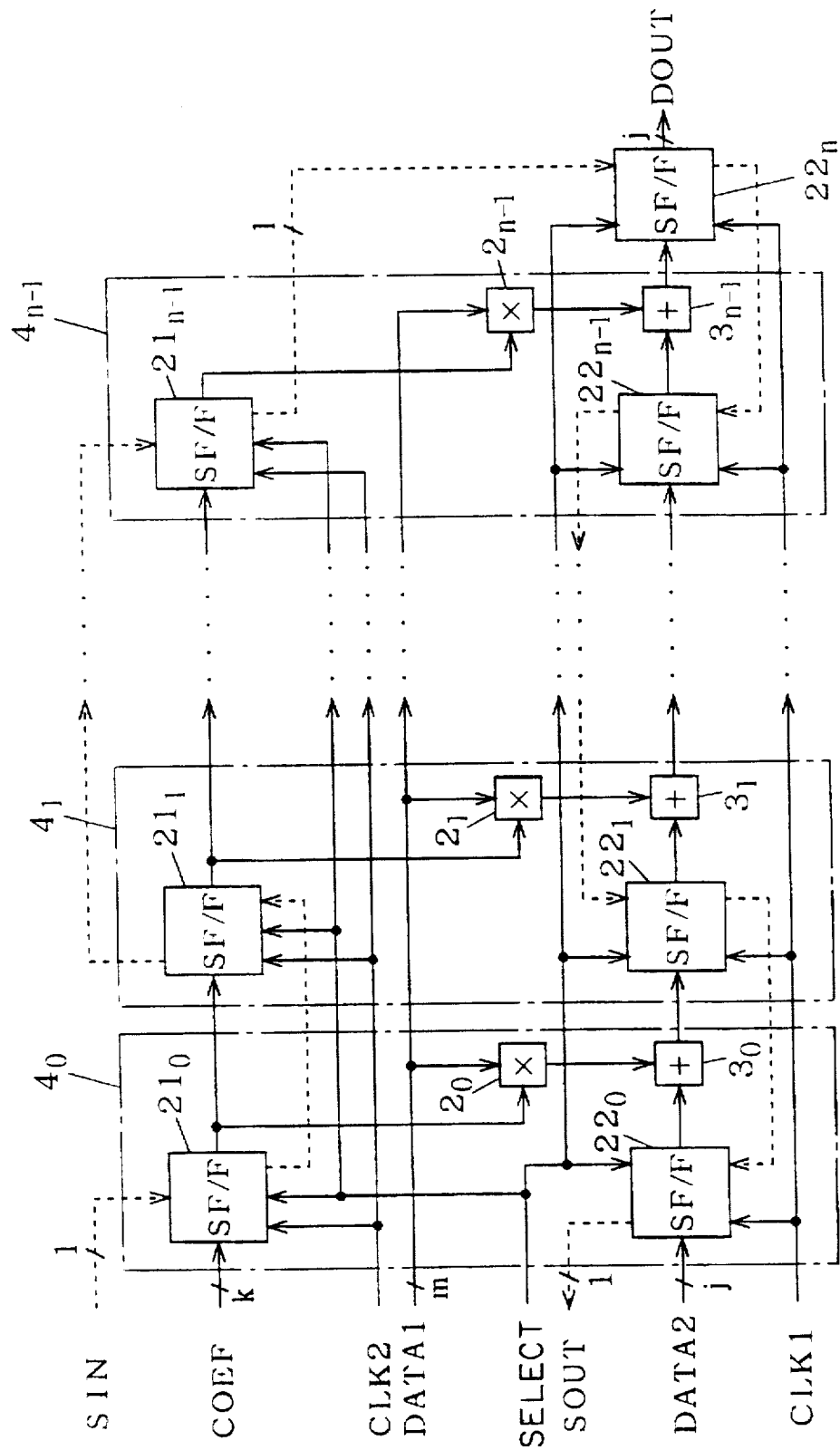
FIG. 1 is a block diagram showing the structure of a digital filter 101 according to a first preferred embodiment.

FIG. 1 is a block diagram showing the structure of a digital filter 101 according to this preferred embodiment. The digital filter 101 has n multiply-accumulation operation units $4_0$-$4_{n-1}$ connected in a cascade and a scan register (shown as a scan flip-flop here) $22_n$, each multiply-accumulation operation unit $4_i$ (i=0 to n-1) having a multiplier $2_i$, an adder $3_i$, scan registers (shown as scan flip-flops here) $21_i$, $22_i$.

This digital filter 101 obtains $\Sigma C_i \cdot DATA1+DATA2$ (where i=0 to n-1) using an m-bit first data input DATA1 and a k-bit coefficient $C_i$ to achieve filtering processing. The multiplier $2_i$ performs multiplication of the m-bit first data input DATA1 and the k-bit coefficient $C_i$ and applies its result to the adder $3_i$. The adder $3_i$ performs addition of j bits, which adds the output from the multiplier $2_i$ and the output of the scan flip-flop $22_i$ and transmits it to the next stage.

The scan flip-flops $21_i$, $22_i$ process k-bit data and j-bit data, respectively, and both make input/output of a scan signal with 1 bit. Such a scan flip-flop can be realized using the structure 200 shown in FIG. 13 with p=k-1 or p=j-1, for example. The scan flip-flops $21_i$, $22_i$ operate in synchronization with clock signals CLIK2, CLK1, respectively. A control signal SELECT is provided in common to all scan flip-flops $21_i$, $22_i$ and the selection operation of the selector 11 shown in FIG. 14 is changed all at once.

The k-bit data input and the 1-bit scan input of the scan flip-flop $21_i$ of the multiply-accumulation operation unit $4_i$ receive the k-bit data output and the 1-bit scan output of the scan flip-flop $21_{j-1}$ of the multiply-accumulation operation unit $4_{j-1}$ in the previous stage, respectively. The j-bit data input and the 1-bit scan input of the scan flip-flop $22_i$ receive the j-bit data output of the adder $3_{i-1}$ of the multiply-accumulation operation unit $4_{i-1}$ in the previous stage and the 1-bit scan output of the scan flip-flop $22_{i+1}$ in the next stage, respectively.

The k-bit data input and the 1-bit scan input of the scan flip-flop $21_0$ of the first stage multiply-accumulation operation unit $4_0$ receive a k-bit coefficient input COEF and a scan-in signal SIN, respectively. The second data input DATA2 is given as the j-bit data input to the scan flip-flop $22_0$ and its 1-bit scan output is provided as a scan-out signal SOUT of the digital filter 101.

Since digital filters are usually designed on condition that they are cascaded, the scan flip-flop $22_0$ is provided in the first stage multiply-accumulation operation unit $4_0$. The scan flip-flop $22_0$ can be eliminated when the digital filter 101 is used alone or when a plurality are connected in a cascade if it is determined to be located in the head, because then there is no need to receive an output of an adder from the previous stage. The second data input DATA2 is not necessary in this case, and the scan output of the scan flip-flop $22_1$ of the multiply-accumulation operation unit $4_1$ is outputted from the digital filter 101 as the scan-out signal SOUT.

The 1-bit scan output of the scan flip-flop $21_{n-1}$ of the final stage multiply-accumulation operation unit $4_{n-1}$ is given as the scan input to the scan flip-flop $22_n$ and the 1-bit scan input of the scan flip-flop $22_{n-1}$ receives the scan output of the scan flip-flop $22_n$. The scan flip-flop $22_n$ transmits its j-bit output as an output DOUT of the digital filter 101.

With the digital filter 101 constructed as explained above, normal operation and test operation are achieved as shown below.

(i) In normal operation, the control signal SELECT performs control so that the scan flip-flops $21_0$, $21_1$, . . . . $21_{n-1}$, $22_0$, $22_1$, . . . , $22_n$ selectively receive the data inputs.

In synchronization with the clock signal CLK2, coefficients $C_{n-1}$, . . . . $C_1$, $C_0$ are sequentially given from the coefficient input COEF to the scan flip-flop $21_0$. These coefficients are transmitted sequentially to the scan flip-flops $21_0$, $21_1$, . . . , $21_{n-1}$ in synchronization with the clock signal CLK2 and then the coefficients $C_0$, $C_1$, . . . , $C_{n-1}$ are stored in the scan flip-flops $21_0$, $21_1$, . . . , $21_{n-1}$, respectively.

In each multiply-accumulation operation unit $4_i$, multiplication of the coefficient $C_i$ and the first data input DATA1 is carried out in the multiplier $2_i$, and its result is given as one input to the adder $3_i$.

Next, the clock signal CLK2 is stopped and transition of the clock signal CLK1 is started, and then an output of the adder $3_{i-1}$ of the previous stage multiply-accumulation operation unit $4_{i-1}$ is provided as the other input to the adder $3_i$ through the flip-flop $22_i$ in each multiply-accumulation operation unit $4_i$. Note that the second data input DATA2 is provided as the other input to the adder $3_0$ of the first stage multiply-accumulation operation unit $4_0$.

In more detail, the scan flip-flop $22_i$ outputs its hold value at the timing of transition of the clock signal CLK1 from "L" to "H" (rise) and newly holds input. Accordingly, the clock signal CLK1 rises (n+1) times corresponding to the number of scan flip-flops $22_0$-$22_n$ and then the filter processed output DOUT of the digital filter 101 is obtained from the scan flip-flop $22_n$.

Figure 12:
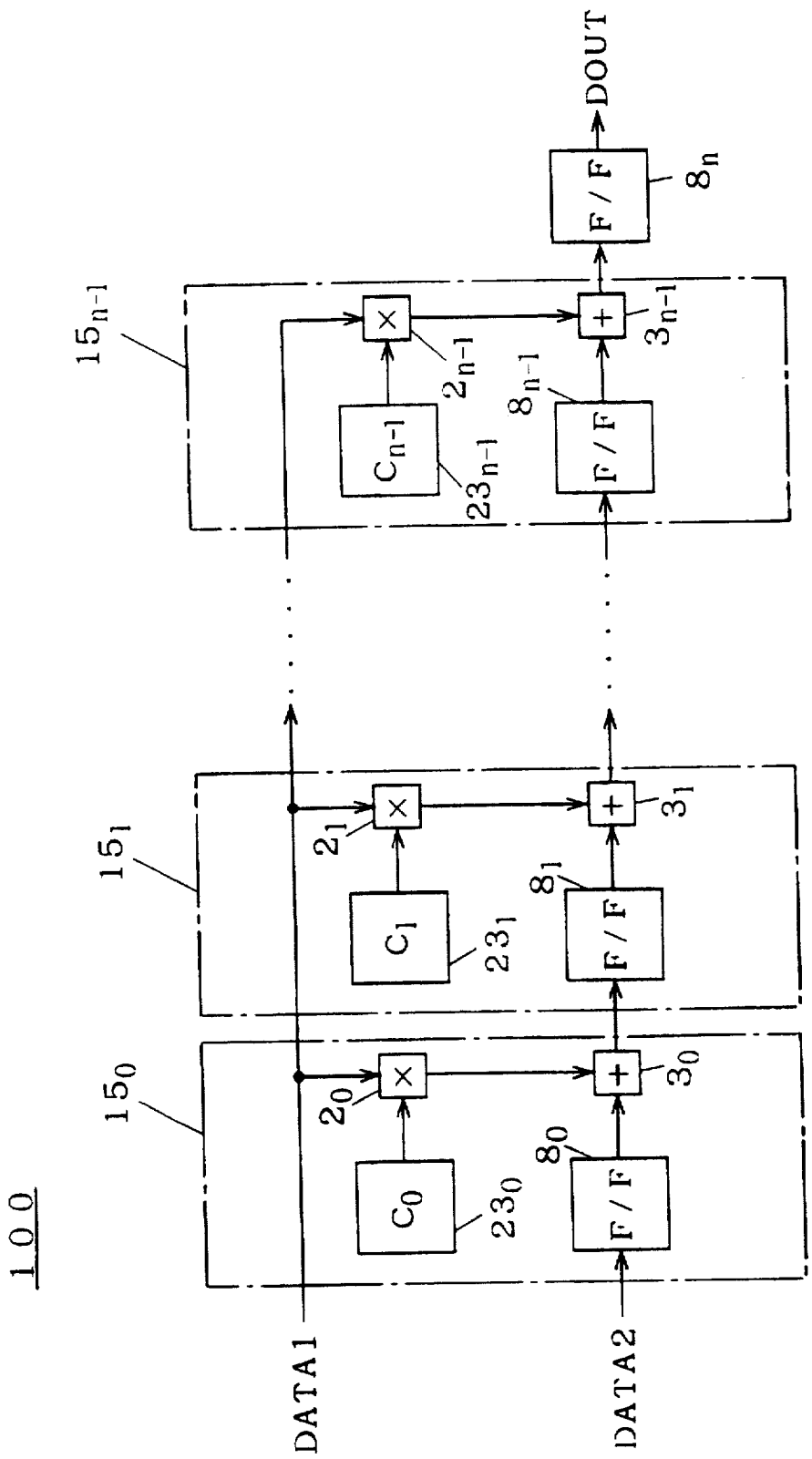
FIG. 12 is a block diagram showing the structure of a conventional digital filter 100.

Such operation based on the clock signal CLK1 is the same as the normal operation of the conventional digital filter 100 shown in FIG. 12, which is not inferior to it.

Figure 2:
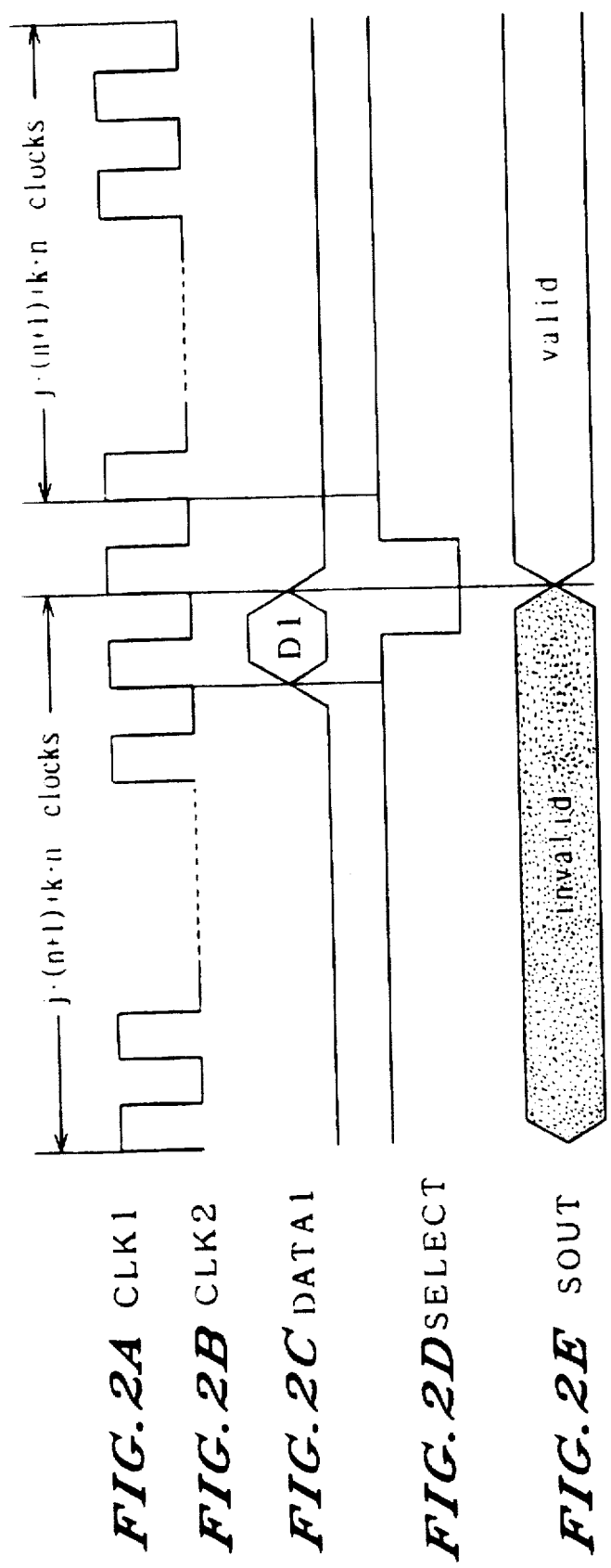
FIG. 2 is a timing chart showing operation of the first preferred embodiment.

(ii) FIG. 2 is a timing chart showing waveforms of the clock signals CLK1, CLK2, the control signal SELECT and the scan-out signal SOUT in test operation of the digital filter 101.

In test operation, the control signal SELECT performs control so that the scan flip-flops $21_0$, $21_1$, . . . . $21_{n-1}$, $22_0$, $22_1$, . . . . $22_n$ selectively receive the scan inputs. Here, it is assumed that the value for causing scan input is "H" and the value for causing data input is "L".

The clock signals CLK1, CLK2 exhibit waveforms making the same transitions. Test data is sequentially applied bit by bit to the scan-in signal SIN, which are sequentially transmitted to the scan flip-flops $21_0$, $21$, . . . , $21_{n-1}$, $22_n$, . . . . $21_1$, $22_0$ through the scan path in synchronization with transitions of the clock signals CLK1, CLK2. It is necessary in order to carry out a test to cause the scan flip-flops $21_0$-$21_{n-1}$ to store k-bit data and the scan flip-flops $22_0$-$22_n$ to store j-bit data. Therefore $\{j \cdot (n+1)+k \cdot n\}$ rises of the clock signals CLK1 and CLK2 are required to store the test data.

A value D1 is given as first data DATA1 for one period of the clock signals CLK1, CLK2 after the $\{j \cdot (n+1)+k \cdot n\}$-th rise. Then the value D1 of the first data DATA1 is multiplied by the k-bit test data stored in each of the scan flip-flops $21_0$, $21_1$, ..., $21_{n-1}$, results of which are added with the j-bit test data stored in the scan flip-flops $22_0$-$22_{n-1}$ in the adders $3_0$-$3_{n-1}$, respectively.

The control signal SELECT is caused to make transition so that it takes the value "L" at the $\{j \cdot (n+1)+k \cdot n+1\}$-th rise of the clock signals CLK1, CLK2. Thus outputs of the adders $3_0$-$3_{n-1}$ are stored in the scan flip-flops $22_1$-$22_n$, respectively.

Next, the control signal SELECT is caused to make transition so that it again takes the value "H" at and after the $\{j \cdot (n+1)+k \cdot n+2\}$-th clock signals CLK1, CLK2. Hence, after that, data is obtained as the scan-out signal SOUT through the scan path. The first j bits of the scan-out signal SOUT are data stored in the scan flip-fop $22_0$ and examining this value allows determination as to whether the test data has been correctly transmitted through the scan path. The j·n bits of the scan-out signal SOUT obtained thereafter are values stored in the scan flip-flops $22_1$-$22_n$, which respectively show operation results of the multiply-accumulation operation units $4_0$-$4_{n-1}$. Therefore conditions of all multiply-accumulation operation units can be determined by examining them. The following k·n bits are values stored in the scan flip-flops $21_{n-1}$-$21_1$ and examining them allows determination as to whether the test data has been correctly transmitted through the scan path.

For example, as the test data, if the first j·(n+1) bits are set to the same values for every j bits and the next k·n bits are set to the same values for every k bits, then operation results of all multiply-accumulation operation units can be equal when the digital filter 101 is normal. With test data set this way, if the digital filter 101 normally operates, data for j·n bits after the j-th bit in the scan-out signal SOUT provide the same values for every j bits and the k·n bits after that provide the same values for every k bits. Accordingly, whether the digital filter 101 is good or bad can be determined by comparing the scan-out signal SOUT with expected values.

Testing in this way allows tests with the same contents to be performed at the same time separately for each multiply-accumulation operation unit, which permits reduction in test vectors and test time.

As has been stated above, the scan flip-flop $22_0$ can be omitted in the first stage multiply-accumulation operation unit $4_0$. In this case, the number of clocks required for storage of test data can be only (j+k)·n. In evaluation of the scan-out signal SOUT, it can be evaluated whether operation results of the multiply-accumulation operation units $4_0$-$4_{n-1}$ are correct or not by checking the j·n bits and it can be evaluated whether the test data has been correctly transmitted through the scan path by checking the following k·n bits. In this case, the number of clocks shown in FIG. 2 is replaced by (j+k)·n.

Second Preferred Embodiment.

Figure 3:
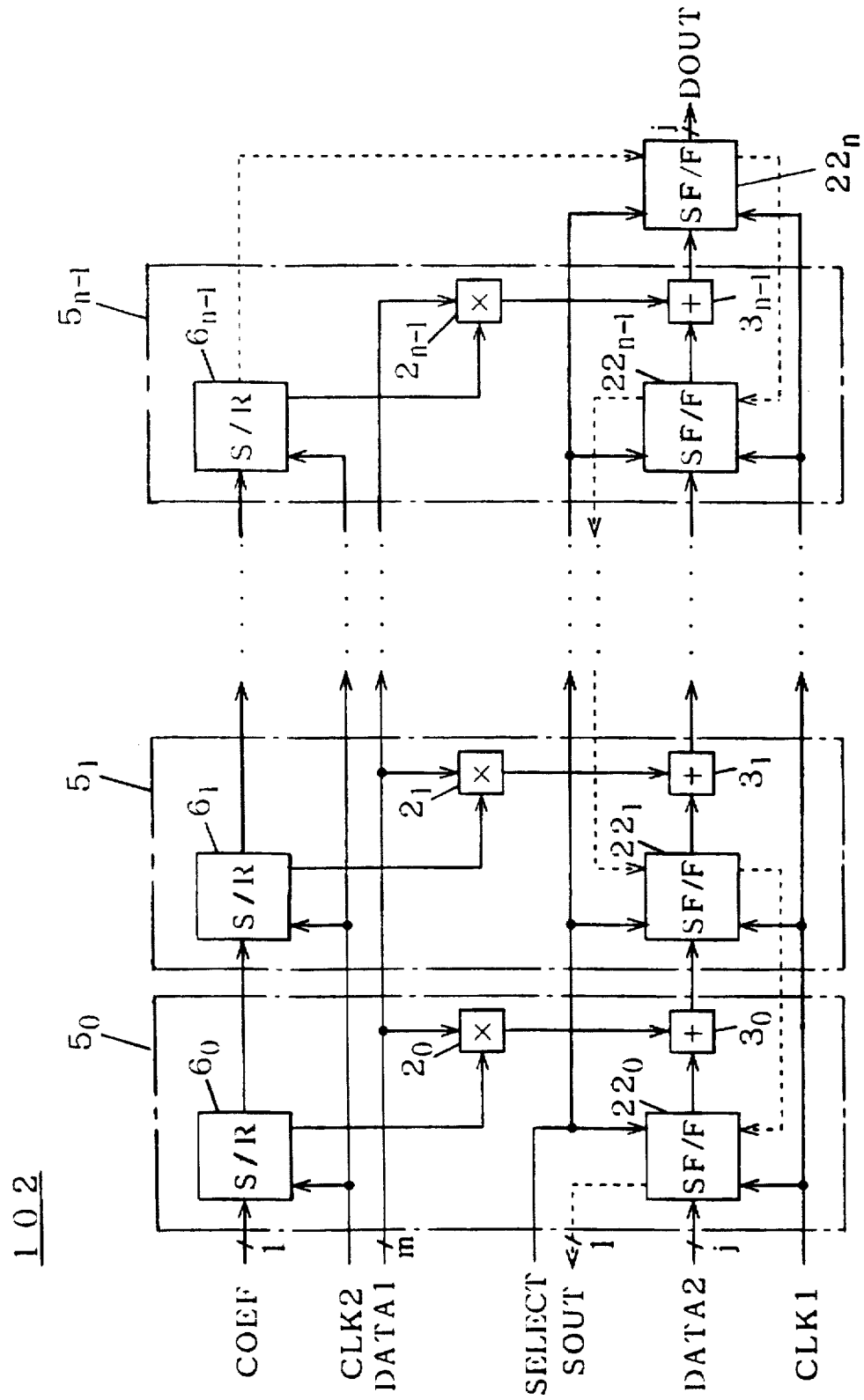
FIG. 3 is a block diagram showing the structure of a digital filter 102 according to a second preferred embodiment.

FIG. 3 is a block diagram showing the structure of a digital filter 102 according to this preferred embodiment. The digital filter 102 has multiply-accumulation operation units $5_i$(i=0 to n-1) substituted for the multiply-accumulation operation units $4_i$ of the digital filter 101 shown in the first preferred embodiment, each multiply-accumulation operation unit $5_i$ having a shift register $6_i$ making input/output with 1 bit and holding data with k bits substituted for the scan register $21_i$ in the multiply-accumulation operation unit $4_i$.

An output of the shift register $6_{i-1}$ of the multiply-accumulation operation unit $5_{i-1}$ on the previous stage is given to the input to the shift register $6_i$ of the multiply-accumulation operation unit $5_i$, which is transmitted to the next stage in synchronization with the clock signal CLK2. The shift register $6_i$ provides its hold value to the adder $2_i$. Note that the input of the shift register $6_0$ of the multiply-accumulation operation unit $5_0$ in the first stage receives the data bit by bit from the coefficient input COEF.

The scan flip-flop $22_i$ receives the same signals as those in the digital filter 101 as its j-bit data input and 1-bit scan input, but the scan flip-flop $22_n$ receives the output of the shift register $6_{n-1}$ as its 1-bit scan input.

The digital filter 102 constructed as explained above performs normal operation and test operation as follows.

(i) In normal operation, the control signal SELECT performs control so that the scan flip-flops $22_0$, $22_1$, ..., $22_n$ selectively receive the data input. The coefficients $C_{n-1}$, ..., $C_1$, $C_0$ are sequentially provided to the shift register $6_0$ bit by bit from the coefficient input COEF in synchronization with the clock signal CLK2. These coefficients are sequentially transmitted through the shift registers $6_0$, $6_1$, ..., $6_{n-1}$ in synchronization with the clock signal CLK2 and then the coefficients $C_0$, $C_1$, ..., $6_{n-1}$ are stored in the shift registers $6_0$, $6_1$, ..., $6_{n-1}$, respectively. The same multiply-accumulation operation as the first preferred embodiment is performed in each multiply-accumulation operation unit $5_i$.

Next, the clock signal CLK2 is stopped and transition of the clock signal CLK1 is started and the output DOUT of the digital filter 102 is thus obtained in the same way as the first preferred embodiment.

Figure 4:
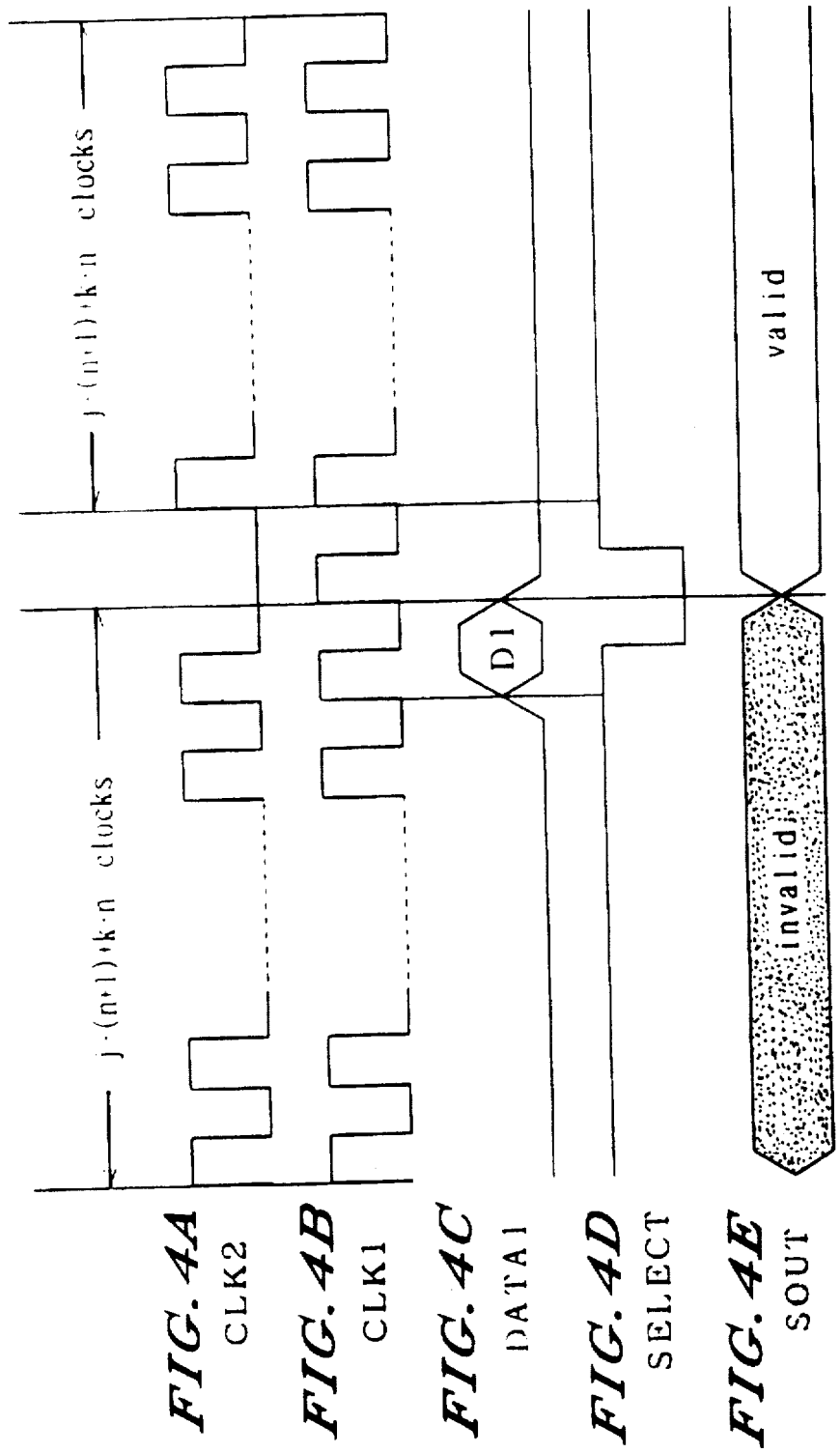
FIG. 4 is a timing chart showing operation of the second preferred embodiment.

(ii) FIG. 4 is a timing chart showing waveforms of the clock signals CLK1, CLK2, the control signal SELECT and the scan-out signal SOUT in test operation of the digital filter 102.

In test operation, the control signal SELECT takes the value "H" to control the scan flip-flops $22_0$, $22_1$, ..., $22_n$ so that they selectively receive the scan input. First, the clock signals CLK1, CLK2 make a certain number of transitions in synchronization with each other.

Test data is sequentially provided from the coefficient input COEF bit by bit, which are sequentially transmitted through the scan path to the shift registers $6_0$, $6_1$, ..., $6_{n-1}$, $22_n$, ..., $22_1$, $22_0$ in synchronization with transitions of the clock signals CLK1, CLK2. The arrows sequentially directed from the coefficient input COEF to the shift registers $6_0$, $6_1$, ..., $6_{n-1}$ are used not only in normal operation but also in test operation, which form a route connected in series to the scan path.

Since it is necessary for test to store k-bit data in the shift registers $6_0$-$6_{n-1}$ and store j-bit data in the scan flip-flops $22_0$-$22_n$, $\{j \cdot (n+1)+k \cdot n\}$ rises of the clock signals CLK1, CLK2 are required as in the first preferred embodiment in order to store the test data.

A value D1 is given as the first data DATA1 for one period of the clock signals CLK1, CLK2 after the $\{j \cdot (n+1)+k \cdot n\}$-th rise. Then the value D1 of the first data DATA1 is multiplied by the k-bit test data stored in each shift register $6_0$, $6_1$, ..., $6_{n-1}$, and the results are added with the j-bit test data stored in the scan flip-flops $22_0$-$22_{n-1}$ in the adders $3_0$-$3_{n-1}$, respectively.

Then only the clock signal CLK1 makes the $\{j \cdot (n+1)+k \cdot n+1\}$-th rise. The control signal SELECT is caused to make a transition so that it takes the value "L" at this time. At this time, the clock signal CLK2 does not rise. Outputs of the adders $3_0$-$3_{n-1}$ are stored in the scan flip-flops $22_1$-$22_n$, respectively.

After that, similarly to the first preferred embodiment, the clock signal CLK1 makes the {j·(n+1)+k·n+2}-th rise and so on. From this time on, the clock signal CLK2 makes transitions in synchronization with the clock signal CLK1 again. At the {j·(n+1)+k·n+2}-th and later rises of the clock signal CLK1, the control signal SELECT is caused to make transition to take the value "H" again. Examining the scan-out signal SOUT obtained in this way allows determination as to whether the digital filter 102 is good or bad, similarly to the first preferred embodiment.

Thus, in addition to the same effects as those of the first preferred embodiment, the second preferred embodiment produces the effect of realizing the test above with simpler structure of reduced circuit scale because part of the scan flip-flops are replaced by the shift registers. It is also advantageous in that it can be applied to the case where data of serial type are provided as the coefficient COEF from an external interface.

Needless to say, the scan flip-flop $22_0$ can be omitted in the first stage multiply-accumulation operation unit $5_0$ as has been stated in the first preferred embodiment. In this case, the number of clocks shown in FIG. 4 is replaced by (j+k)·n.

It is clear that the operation in the first preferred embodiment can also be realized using the clock signals CLK1, CLK2 shown in FIG. 4.

Third Preferred Embodiment.

Figure 5:
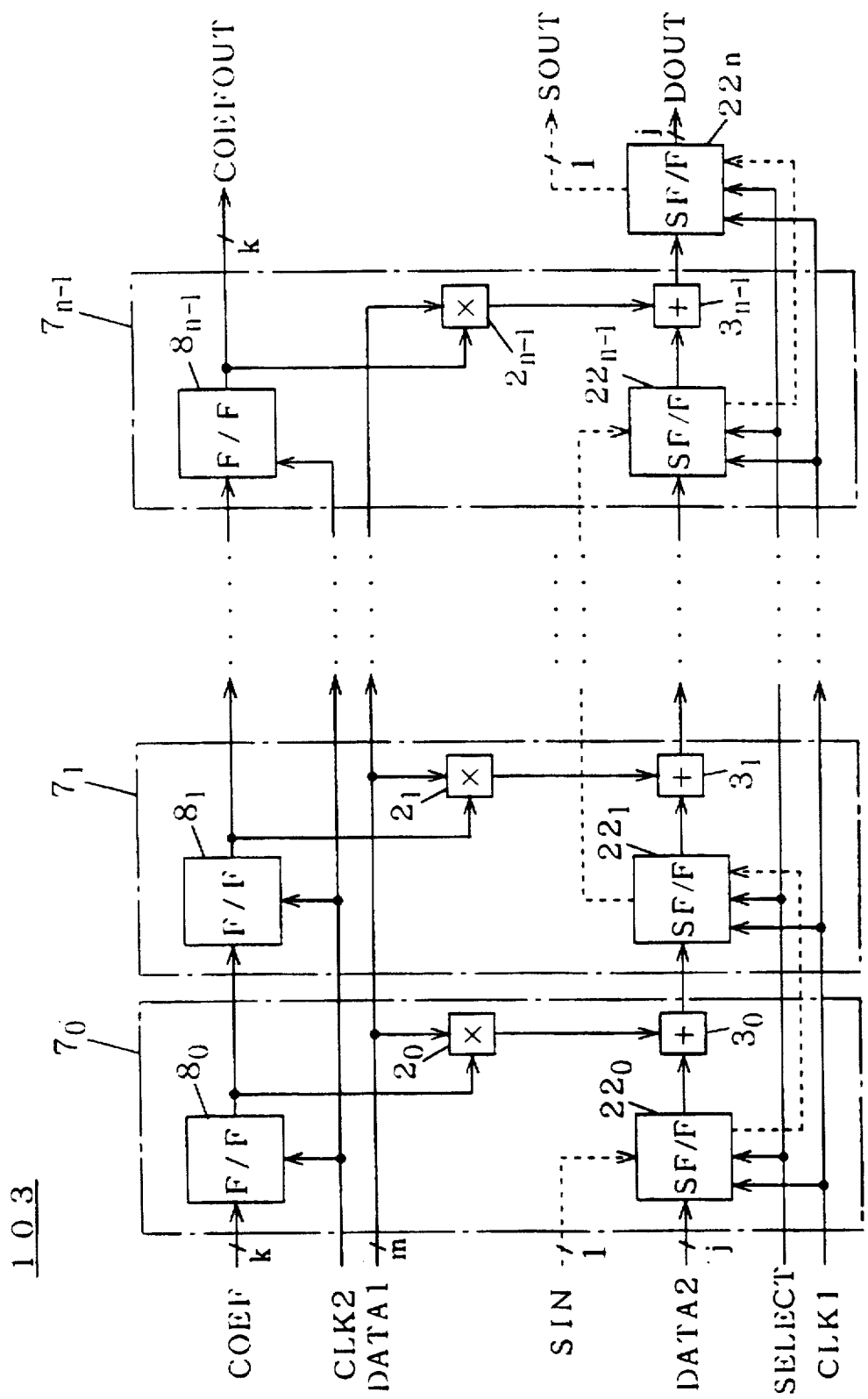
FIG. 5 is a block diagram showing the structure of a digital filter 103 according to a third preferred embodiment.

FIG. 5 is a block diagram showing the structure of a digital filter 103 according to this preferred embodiment. The digital filter 103 has multiply-accumulation operation units $7_i$(i=0 to n-1) replacing the multiply-accumulation operation units $5_i$ of the digital filter 102 shown in the second preferred embodiment, each multiply-accumulation operation unit $7_i$ having a shift register (shown as a flip-flop in FIG. 5) $8_i$ making input/output with k bits and holding data with k bits replacing the shift register $6_i$ in the multiply-accumulation operation unit $5_i$.

An output of the shift register $8_{i-1}$ in the multiply-accumulation operation unit $7_{i-1}$ in the previous state is provided to an input of the shift register $8_i$ of the multiply-accumulation operation unit $7_i$, which is transmitted to the next stage in synchronization with the clock signal CLK2. The shift register $8_i$ provides its hold value to the adder $2_i$. Note that the input of the shift register $8_0$ of the multiply-accumulation operation unit $7_0$ in the first stage receives the data of k bits at a time (k-bit data) from the coefficient input COEF. The output of the shift register $8_{n-1}$ of the multiply-accumulation operation unit $7_{n-1}$ in the final stage is subjected to a test as a coefficient output COEFOUT, as will be described later.

Data input of j bits of the scan flip-flop $22_i$ is the same as those in the first and second preferred embodiments but the scan path is formed only of the scan flip-flops $22_0, 22_1, \ldots, 22_n$. In FIG. 5, the flow of the scan signal is opposite to that in the first and second preferred embodiments. That is to say, the 1-bit scan-in signal SIN is first provided as a scan input to the scan flip-flop $22_0$ of the multiply-accumulation operation unit $7_0$ in the first stage and then sequentially transmitted to the scan flip-flops $22_1, \ldots, 22_{n-1}, 22_n$ in synchronization with the clock signal CLK1. Output of the scan flip-flop $22_n$ is subject to test as the scan-out signal SOUT, as will be described later.

With the digital filter 103 constructed as stated above, normal operation and test operation are conducted as follows.

(i) The normal operation, where only the shift registers $6_i$ are replaced by the shift registers $8_i$ in the normal operation in the second preferred embodiment, is the same as the normal operation in the second preferred embodiment except that the coefficient $C_i$ sequentially provided from the coefficient input COEF is transmitted by k-bit. That is, the same multiply-accumulation operation as the first preferred embodiment is carried out in each multiply-accumulation operation unit $7_i$, and an output DOUT of the digital filter 103 is obtained by stopping the clock signal CLK2 and starting transition of the clock signal CLK1.

Figure 6:
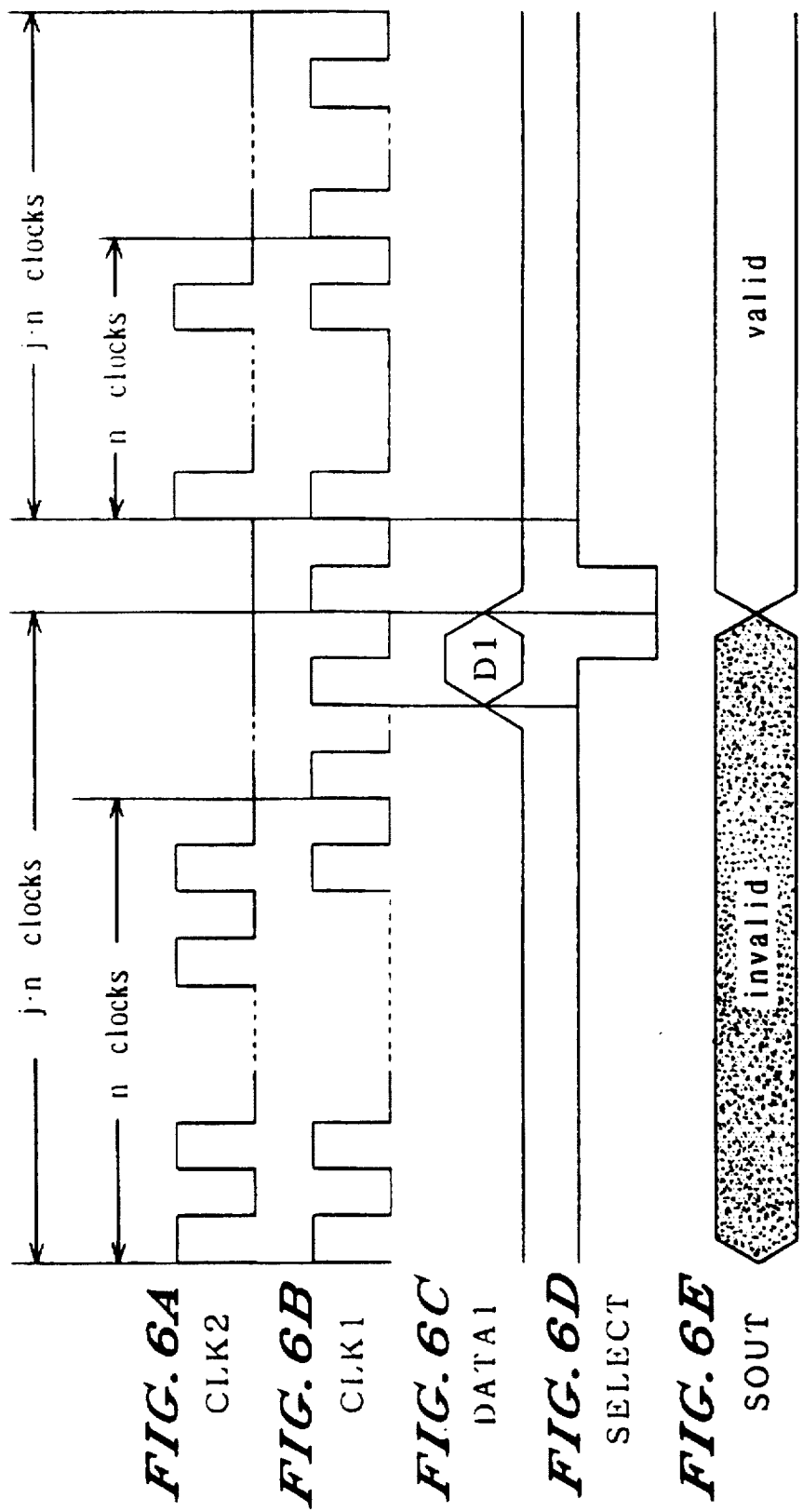
FIG. 6 is a timing chart showing operation of the third preferred embodiment.

(ii) FIG. 6 is a timing chart showing waveforms of the clock signals CLK1, CLK2, the control signal SELECT and the scan-out signal SOUT in test operation of the digital filter 103.

In test operation, the control signal SELECT makes control so that the scan flip-flops $22_0$-$22_n$ selectively receive the scan input. While the scan-in signal SIN is provided bit by bit to the scan path formed of the scan flip-flops $22_0$-$22_{n-1}$, it is necessary to cause these scan flip-flops $22_0$-$22_{n-1}$ to store j-bit data. In order to cause them to store the test data, the clock signal CLK1 must rise j·n times.

Test data is sequentially given k bits at a time (k-bit data) from the coefficient input COEF independently of storage of the test data in the scan flip-flops $22_0$-$22_n$, which are sequentially transmitted to the shift registers $8_0, 8_1, \ldots, 8_{n-1}$ in synchronization with transitions of the clock signal CLK2. As it is necessary to cause each of the shift registers $8_0$-$8_{n-1}$ to store data of k bits, the clock signal CLK2 must rise n times. While FIG. 6 shows the case in which the first rises of the clock signals CLK1, CLK2 are synchronized, the period necessary to store the test data is determined only by transitions of the clock signal CLK1, not by transitions of the clock signal CLK2, so long as the clock signal CLK2 rises n times while the clock signal CLK1 rises j·n times.

After the (j·n)-th rise of the clock signal CLK1, the value D1 is provided as the first data DATA1 for only one period of the clock signal CLK1. The value D1 of the first data DATA1 is thus multiplied by the k-bit test data stored in each shift register $8_0, 8_1, \ldots, 8_{n-1}$, and the results are added in the adders $3_0$-$3_{n-1}$ with the j-bit test data stored in the scan flip-flops $22_0$-$22_{n-1}$, respectively.

Then only the clock signal CLK1 makes the (j·n+1)-th rise. The control signal SELECT is caused to make a transition to take the value "L" at this time. The clock signal CLK2 does not rise at this time. Outputs of the adders $3_0$-$3_{n-1}$ are stored in the scan flop-flops $22_1$-$22_n$, respectively. The control signal SELECT is controlled to take the value "H" at rises of the clock signal CLK1 thereafter.

The data stored in the scan flip-flops $22_1$-$22_n$ can be sequentially read out as the scan-out signal SOUT as the clock signal CLK1 further rises j·n times. Independently of it, the data transmitted through the shift registers $8_0$-$8_{n-1}$ can be read as the coefficient output COEFOUT as the clock signal CLK2 further rises n times. Similarly to the storage of the test data, the coefficient output COEFOUT can be read while the scan-out signal SOUT is being read.

Comparison of the scan-out signal SOUT and the coefficient output COEFOUT with certain expected values allows determination as to whether operation results of the multiply-accumulation operation units $7_i$ and the shift registers $8_i$ are good or bad. Similarly to the first preferred embodiment, for example, data which takes the same values for every j bits is provided as the scan-in signal SIN and data which takes the same values for every k bits is provided as the test data as the coefficient. With such data, if the scan-out signal SOUT presents the same values for every j bits and the coefficient output COEFOUT presents the same values of k-bit for each clock, the digital filter 103 can be determined to be normal.

In addition to the same effects as the first preferred embodiment, the third preferred embodiment provides the effect of realizing the test with simpler structure having reduced circuit scale because part of the scan flip-flops are replaced by the shift registers. Furthermore, the scan path is shortened and conditions of the shift registers $8_i$ for holding the coefficient $C_i$ can be determined independently of determination of conditions of the scan flop-flops $22_i$ using the coefficient output COEFOUT, and also the times required to store the test data and read the data subject to test can be reduced.

It is a matter of course that the scan flip-flop $22_0$ can be omitted in the multiply-accumulation operation unit $7_0$ on the first stage as has been stated in the first preferred embodiment. The flow of the scan path can be opposite to the direction shown in FIG. 5.

B. Second Invention:

A second invention of this application relates to technique which allows a test with a reduced number of test vectors without using scan registers.

Fourth Preferred Embodiment.

Figure 7:
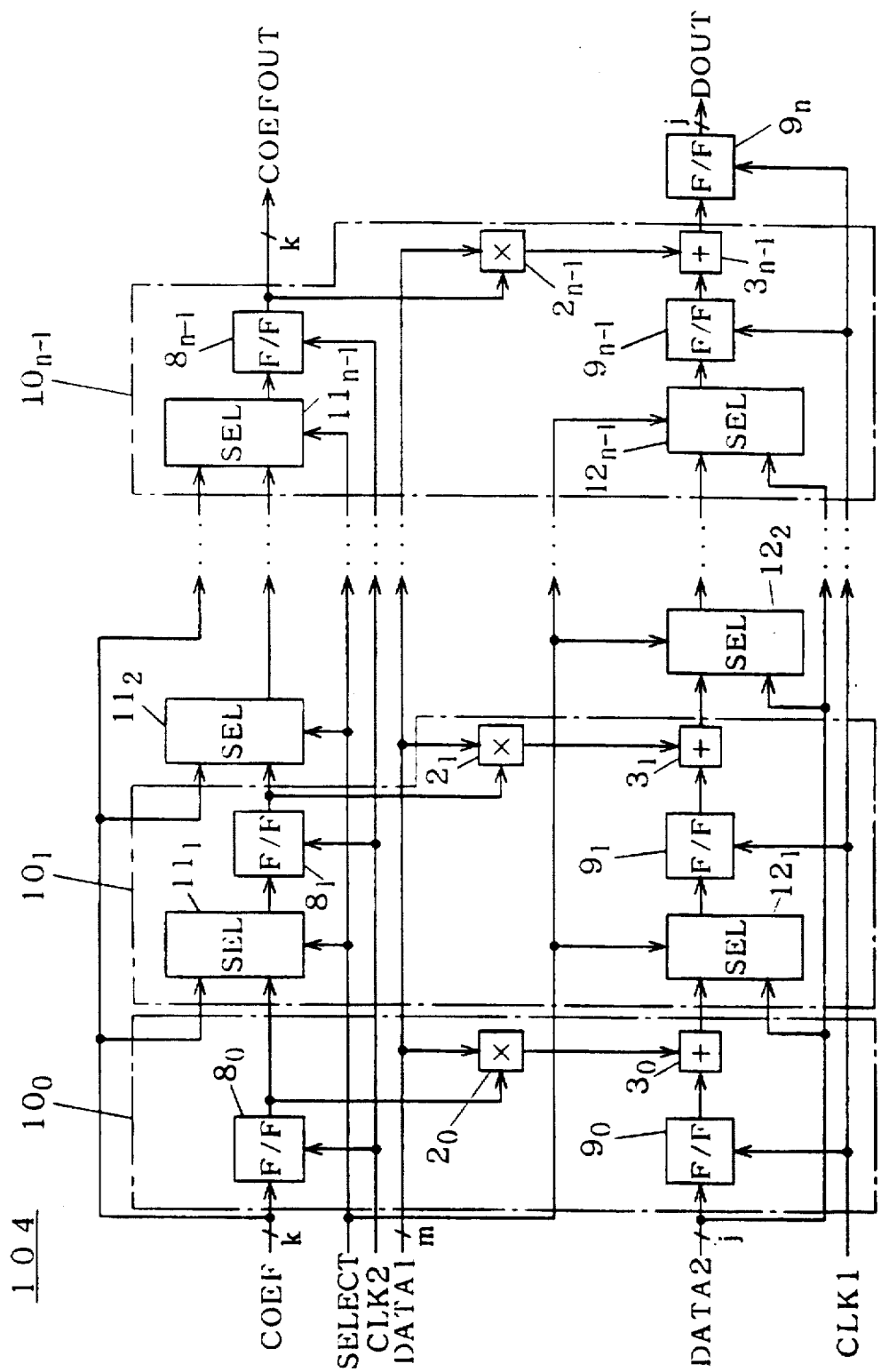
FIG. 7 is a block diagram showing the structure of a digital filter 104 according to a fourth preferred embodiment.

FIG. 7 is a block diagram showing the structure of a digital filter 104 according to this preferred embodiment. In the structure of the digital filter 104, the multiply-accumulation operation units $4_i$(i=0 to n-1) and the scan flip-flop $22_n$ in the digital filter 101 shown in the first preferred embodiment are replaced by multiply-accumulation operation units $10_i$ and a shift register $9_n$.

In the structure of the multiply-accumulation operation unit $10_0$, the scan registers $21_0$, $22_0$ in the multiply-accumulation operation unit $4_0$ are replaced by shift register $8_0$ which makes input/output with k bits and hold data with k bits and shift register $9_0$ which makes input/output with j bits and hold data with j bits, respectively.

In the structure of the multiply-accumulation operation unit $10_s$(s=1 to n-1), the scan register $21_s$ in the multiply-accumulation operation unit $4_s$ is replaced by a 2-input 1-output selector $11_s$ and a shift register $8_s$ making input/output with k bits and holding data with k bits, and the scan register $22_s$ is replaced by a 2-input 1-output selector $12_s$ and a shift register $9_s$ making input/output with k bits and holding data with k bits.

Provided to the first input end of the selector $11_s$ of the multiply-accumulation operation unit $10_s$ is an output of the shift register $8_{s-1}$ of the multiply-accumulation operation unit $10_{s-1}$ in the previous stage. The input of the shift register $8_0$ of the multiply-accumulation operation unit $10_0$ on the first stage receives data k bits at a time from the coefficient input COEF. The k-bit data from the coefficient input COEF are received at the second input ends of the selectors $11_s$ in common. The selector $11_s$ selectively outputs the data applied to its first input end and second input end to the shift register $8_s$ in response to "L", "H" of the control signal SELECT. The shift register $8_i$ transmits its hold value to the multiplier $2_i$ and to the next stage in synchronization with the clock signal CLK2. Output of the shift register $8_{n-1}$ of the multiply-accumulation operation unit $10_{n-1}$ in the final stage is subjected to a test as a coefficient output COEFOUT, as will be described later.

Provided to the first input end of the selector $12_s$ of the multiply-accumulation operation unit $10_s$ is an output of the adder $3_{s-1}$ of the multiply-accumulation operation unit $10_{s-1}$ in the previous stage. The input of the shift register $9_0$ of the first stage multiply-accumulation operation unit $10_0$ receives data by j bits from the second data input DATA2. The selectors $12_s$ receive the j-bit data in common at their respective second input ends from the second data input DATA2. The selector $12_s$ selectively outputs the data applied to its first input end and second input end to the shift register $9_s$ according to the control signal SELECT taking "L", "H". The shift register $9_i$ transfers its hold value to the adder $3_i$ in synchronization with the clock signal CLK1. The output of the adder $3_{n-1}$ of the final stage multiply-accumulation operation unit $10_{n-1}$ via the shift register $9_n$ operating in synchronization with the clock signal CLK1 functions as an output DOUT which serves both as a normal operation filter processing result and as an object of test as will be described later.

The digital filter 104 configured as stated above performs normal operation and test operation as follows.

(i) In normal operation, the control signal SELECT is set to "L" and the selectors $11_s$ and $12_s$ function to output the data given to their respective first input ends. In synchronization with the clock signal CLK2, coefficients $C_{n-1}, \ldots, C_1$, $C_0$ are provided sequentially by k-bit to the shift register $8_0$ from the coefficient input COEF. These coefficients are sequentially transmitted through the shift registers $8_0$, $8_1$ . . . $8_{n-1}$ in synchronization with the clock signal CLK2 so that the shift registers $8_0$, $8_1$, . . . , $8_{n-1}$ can store the coefficients $C_0$, $C_1$, . . . , $C_{n-1}$ respectively.

In each multiply-accumulation operation unit $10_i$, multiplication of the coefficient $C_i$ and the first data input DATA1 is made in the multiplier $2_i$ and its result is provided as one input to the adder $3_i$.

Next, the clock signal CLK2 is stopped and transition of the clock signal CLK1 is started, and then, in each multiply-accumulation operation unit $10_s$, the output of the adder $3_{s-1}$ of the previous stage multiply-accumulation operation unit $10_{s-1}$ is provided as the other input of the adder $3_s$ through the selector $12_s$ and the shift register $9_s$. Note that the second data input DATA2 is provided as the other input to the adder $3_0$ of the first stage multiply-accumulation operation unit $10_0$ via the shift register $9_0$.

The clock signal CLK1 continuously makes transitions, and the output DOUT of the digital filter 104 is thus finally obtained similarly to the first preferred embodiment.

Figure 8:
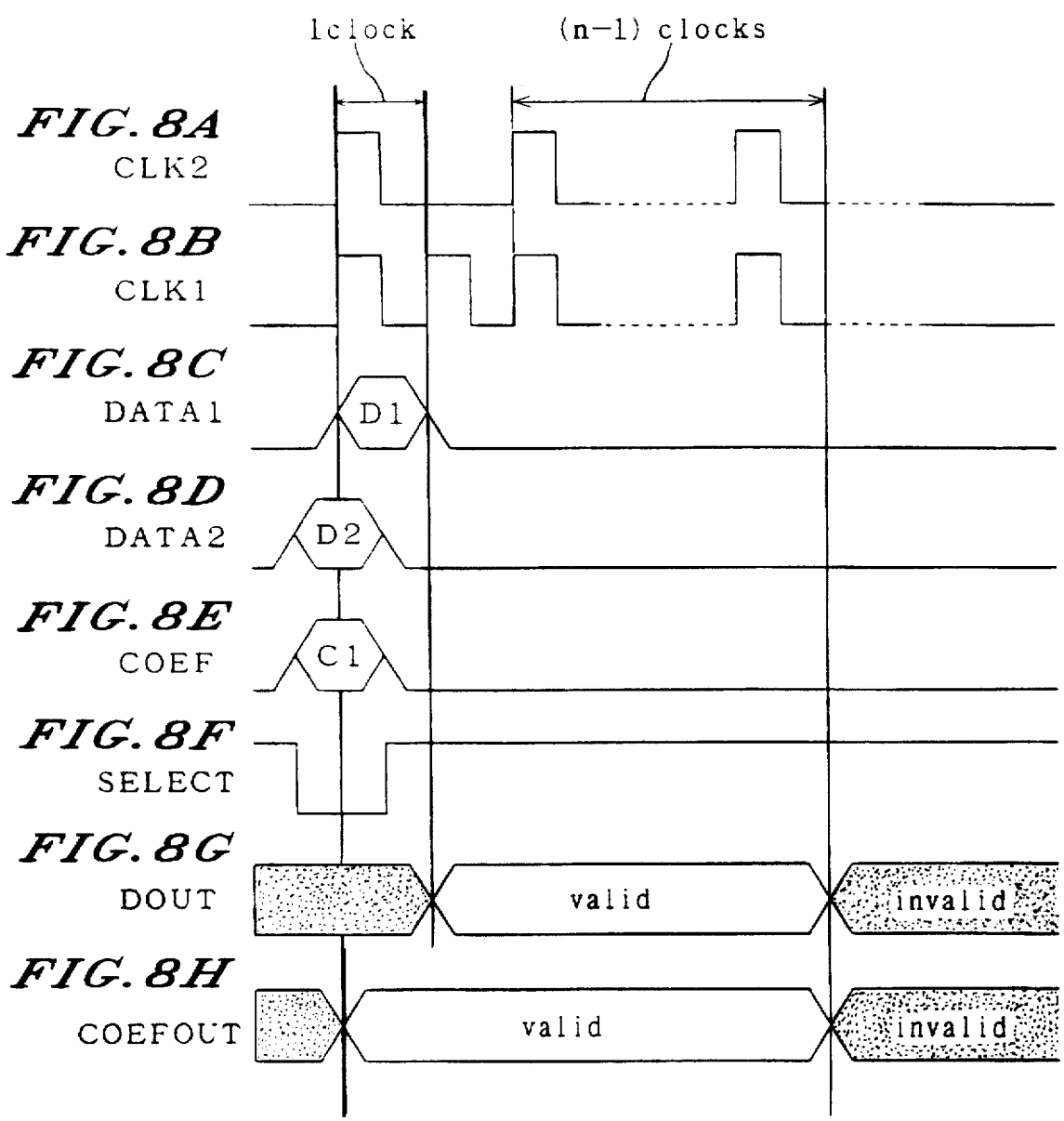
FIG. 8 is a timing chart showing operation of the fourth preferred embodiment.

(ii) FIG. 8 is a timing chart showing waveforms of the clock signals CLK1, CLK2, the control signal SELECT, and the output DOUT in test operation of the digital filter 104.

While the clock signals CLK1, CLK2 rise in synchronization, the control signal SELECT takes "L" before that to control the selectors $11_s$, $12_s$ so that they output the data applied to their respective first input ends. Test data C1 of k-bit is provided from the coefficient input COEF and test data D2 of j-bit is provided as the second data input DATA2, respectively. This allows the test data C1 to be applied to the shift register $8_i$ and the test data D2 to be applied to the shift register $9_i$ prior to the first rises of the clock signals CLK1 and CLK2.

The first rises of the clock signals CLK1, CLK2 cause the test data C1 applied to the shift register $8_i$ to be transmitted to the multiplier $2_i$ and the test data D2 applied to the shift register $9_i$ to be transmitted to the adder $3_i$. Thus, when the effective value D1 is applied to the first data input DATA1 thereafter, an operation result of the multiply-accumulation operation unit $10_i$ is obtained as an output of the adder $3_i$ with j bits of (C1×D1+D2).

After that, the control signal SELECT makes a transition to "H" before only the clock signal CLK1 rises (at this time, the first data input DATA1 is at "0") and the selectors $12_1$-$12_{n-1}$ output the data applied to their respective second input ends to the shift registers $9_1$-$9_{n-1}$. When the clock signal CLK1 rises alone under such a condition, the operation results of the multiply-accumulation operation units $10_i$ are outputted from the shift registers $9_1$-$9_n$. That is, one of j-bit data is obtained as the output DOUT from the shift register $9_n$.

At this time, it is not necessary to make the clock signal CLK2 rise. This is due to the fact that the number of shift registers $8_0$-$8_{n-1}$ through which the test data C1 is transmitted is n and the first rise of the clock signal CLK2 has already permitted one to be obtained as the coefficient output COEFOUT.

After that, the clock signals CLK1, CLK2 are both caused to make transitions (n-1) times and n data C1 of k-bit and n data of j-bit are thus obtained as the coefficient output COEFOUT and the output DOUT, respectively. It is desirable to set the first data input DATA1 to "0" so that information of the output DOUT is not hurt.

The coefficient output COEFOUT and the output DOUT thus obtained repeat the same data of k-bit and j-bit for each clock, respectively, if the digital filter 104 normally operates. Hence, it is possible to determine whether the digital filter 104 is good or bad by examining the data.

According to this preferred embodiment, the same effects as the first preferred embodiment are obtained. Furthermore, it is possible to determine whether the shift register $8_i$ for holding the coefficient $C_i$ is good or bad using the coefficient output COEFOUT apart from the determination as to whether the shift register $9_i$ is good or bad. Moreover, times required to store the test data and read data subjected to test can be reduced. The test data can be stored with 1 clock and the output DOUT can be read with n clocks as well as the coefficient output COEFOUT.

Fifth Preferred Embodiment.

With the digital filter 104 shown in the fourth preferred embodiment, the determination of condition is made using the output DOUT also in test operation, which depends on whether the value is the same for every j-bit or not. Whether the same value is obtained for every j-bit can be observed by comparing the output DOUT outputted for every j-bit with values outputted before or after it.

Figure 9:
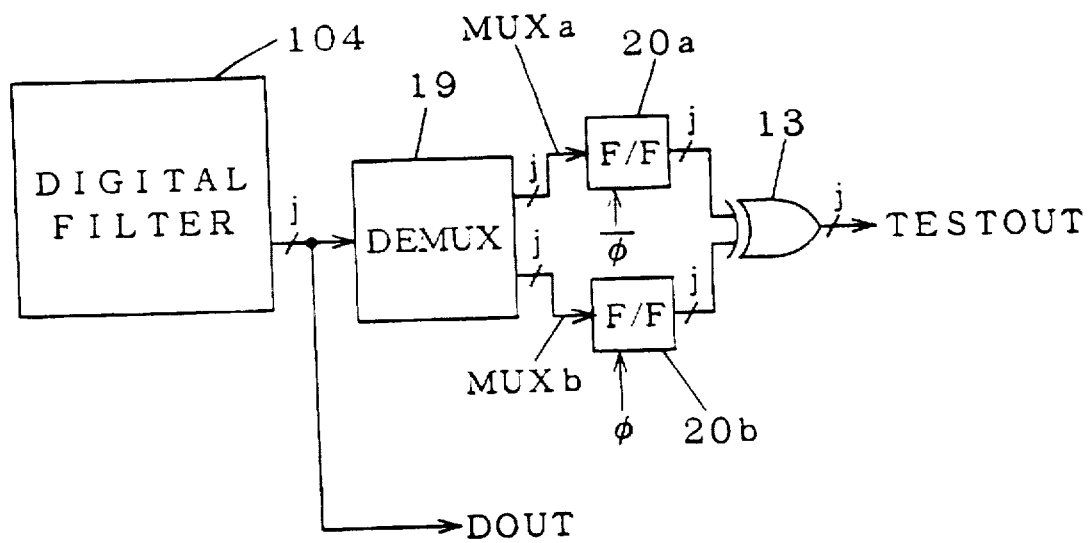
FIG. 9 is a block diagram showing the structure of a digital filter 105 according to a fifth preferred embodiment.

FIG. 9 is a block diagram showing the structure of a digital filter 105 according to this preferred embodiment. The digital filter 105 includes the digital filter 104, a demultiplexer 19 receiving the output DOUT of the digital filter 104 and processing j-bit data with 1 input and 2 outputs, flip-flops 20a, 20b respectively receiving two j-bit outputs of the demultiplexer 19 and an EXOR gate 13 for obtaining an exclusive OR of the two outputs of the flip-flops 20a, 20b.

Figure 10:
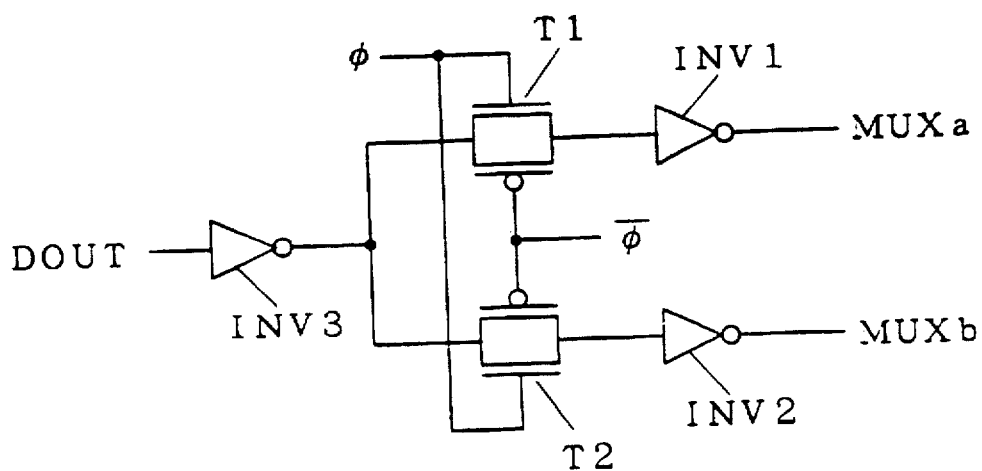
FIG. 10 is a circuit diagram illustrating the structure of the demultiplexer 19.

FIG. 10 is a circuit diagram showing an example of the structure of the demultiplexer 19, which includes an inverter INV3 receiving the output DOUT, two transmission gates T1, T2 receiving output of the inverter INV3, and inverters INV1, INV2 receiving respective outputs of the transmission gates T1, T2 for outputting respective data MUXa, MUXb. The transmission gates T1, T2 complementarily open and close with complementary clock signals $\Phi$, $\overline{\Phi}$. While FIG. 10 shows the structure only for one bit, a plurality thereof are provided for j bits to be used in FIG. 9.

Figure 11:
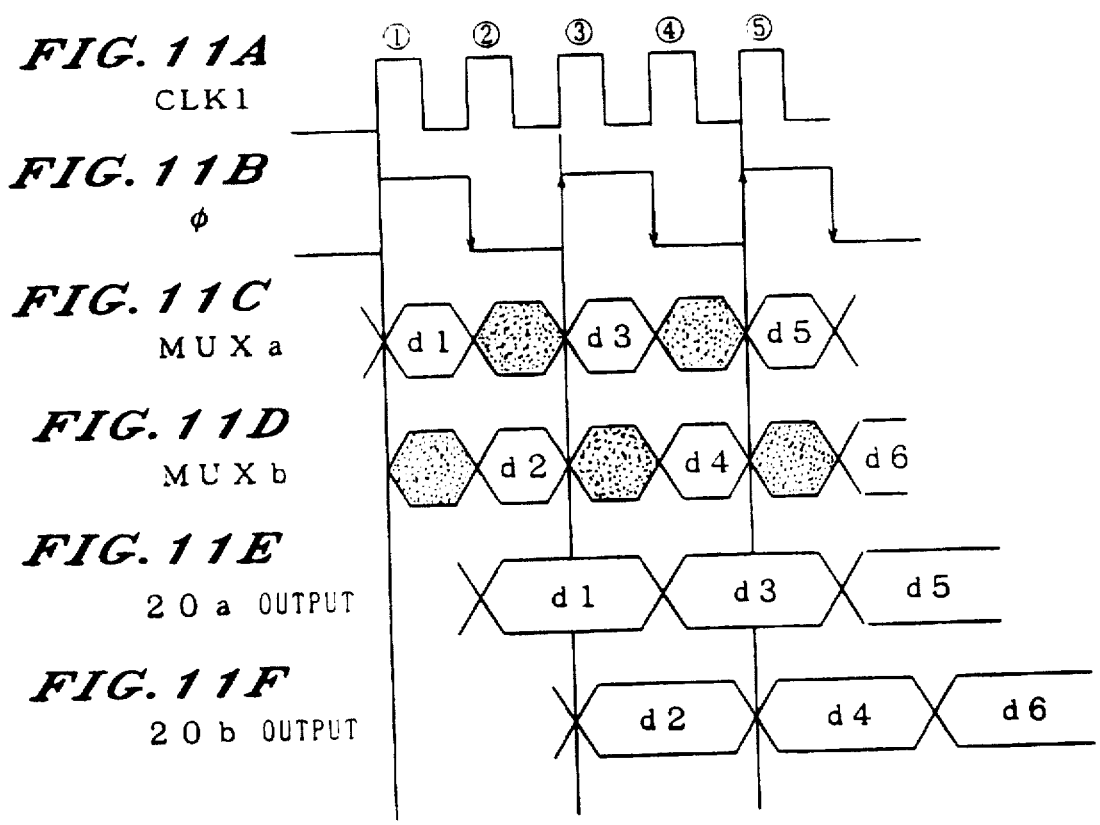
FIG. 11 is a timing chart showing operation of the fifth preferred embodiment.

FIG. 11 is a timing chart showing the interrelation among the clock signals CLK1, $\Phi$, the data MUXa, MUXb and outputs of the flip-flops 20a, 20b. The clock signal $\Phi$ has its period two times that of the clock signal CLK1 without phase shift. Such a clock signal $\Phi$ can be obtained easily by dividing the clock signal CLK1.

Transition of the clock signal $\Phi$ to "H" causes the transmission gate T1 to become conductive and the transmission gate T2 to become non-conductive and the value d1 of the output DOUT outputted in synchronization with the "H" of the clock signal CLK1 shown by $\hat{1}$ is outputted as the data MUXa. After that, the transition of the clock signal $\Phi$ to "L" causes the transmission gate T2 to become conductive and the transmission gate T1 to become non-conductive and the value d2 of the output DOUT outputted in synchronization with the "H" of the clock signal CLK1 shown by $\hat{\phantom{m}}$ is outputted as the data MUXb. Making the flip-flops 20a, 20b operate respectively in synchronization with falls of the clock signal $\Phi$ (rises of the clock signal $\overline{\Phi}$) and in synchronization with rises of the clock signal $\Phi$ allows the values d1, d2, d3, . . . to be held for one period of the clock signal $\Phi$, i.e., for two periods of the clock signal CLK1.

Since the value of the output DOUT makes a transition for each period in synchronization with the clock signal CLK1, evaluating pairs of j-bit values adjacently outputted, (d1, d2), (d2, d3), . . . . in synchronization with the clock signal CLK1 allows determination in the EXOR 13 as to whether the two values constituting the pairs are the same or not. Referring to FIG. 11, it can be checked at the fall from the state $\hat{3}$ of the clock signal CLK1 whether the values d1 and d2 are the same or not, at the fall from the state $\hat{4}$ of the clock signal CLK1 whether the values d2, d3 are the same or not, and at the fall from the state $\hat{5}$ of the clock signal CLK1 whether the value d3 and d4 are the same or not, respectively.

Evaluating the output DOUT in this way makes it possible to determine whether the digital filter 104 is good or bad without requiring a large-scaled test device and test vectors.

Needless to say, a digital filter which outputs the same value for every j-bit in test results when it is normal can be used instead of the digital filter 104 in this preferred embodiment. Furthermore, it is not essential to incorporate the demultiplexer 19, the flip-flops 20a, 20b and the EXOR gate 13 as a part of the digital filter like the digital filter 105, but these components may be provided separately from the digital filter 104.

While the invention has been described in detail, the foregoing description is in all aspects illustrative and not restrictive. It is understood that numerous other modifications and variations can be devised without departing from the scope of the invention.

We claim:

1. A digital filter comprising a cascade connection of 0-th to (n-1)-th multiply-accumulation operation units (n: a natural number of 2 or larger), wherein said 0-th multiply-accumulation operation unit includes a multiplier performing a multiplication of data to be processed by said digital filter and a 0-th coefficient, and each said s-th ($1 \leq s \leq (n-1)$) multiply-accumulation operation unit includes, a multiplier performing a multiplication of said data and an i-th coefficient, a scan register selectively outputting a data input which is an output of said (s-1)-th multiply-accumulation operation unit and a scan input according to a control signal on the basis of a first clock signal, and an adder performing an addition of an output of said multiplier and an output of said scan register and outputting the result to a next stage, wherein said scan registers of said first through (n-1)-th multiply-accumulation operation units form a scan path, and a result of filtering processing to said data input is obtained from the output of said (n-1)-th multiply-accumulation operation unit.

2. The digital filter according to claim 1, further comprising a final stage scan register selectively outputting a data input which is the output of said (n-1)-th multiply-accumulation operation unit and a scan input according to a control signal, wherein said final stage scan register also forms said scan path.

3. The digital filter according to claim 2, wherein said 0-th multiply-accumulation operation unit further includes a first stage scan register selectively outputting a data input which is an output of said (s-1)-th multiply-accumulation operation unit and a scan input according to said control signal and an adder performing an addition of an output of said multiplier and an output of said scan register and said adder outputting its result to a next stage, said first stage scan register also forming said scan path.

4. The digital filter according to claim 1, wherein each said i-th ($0 \leq i \leq (n-1)$) multiply-accumulation operation unit further includes a shift register providing said i-th coefficient to said multiplier, wherein said shift registers of said 0-th to (n-1)-th multiply-accumulation operation units are connected in series with each other.

5. The digital filter according to claim 4, wherein said shift registers of said 0-th to (n-1)-th multiply-accumulation operation units can make input/output with the number of bits required for said i-th coefficient.

6. The digital filter according to claim 4, wherein said shift registers of said 0-th to (n-1)-th multiply-accumulation operation units can make input/output with 1 bit, and are connected in series to each other and connected to said scan path.

7. The digital filter according to claim 1, wherein each said i-th ($0 \leq i < (n-1)$) multiply-accumulation operation unit further includes a register providing said i-th coefficient to said multiplier, wherein said registers of said 0-th to (n-1)-th multiply-accumulation operation units are connected in series with each other and connected to said scan path.

8. The digital filter according to claim 7, wherein said register of said i-th multiply-accumulation operation unit is a shift register which can make input/output with 1 bit.

9. The digital filter according to claim 7, wherein said register of said i-th multiply-accumulation operation unit is a scan register operating on the basis of a second clock signal and serving as a component of said scan path, said scan register selectively outputting a data input and a scan input according to said control signal, at least said i-th coefficient being supplied as said data input of said scan register.

10. A digital filter comprising a cascade connection of 0-th to (n-1)-th multiply-accumulation operation units (n:a natural number of 2 or larger), wherein said 0-th multiply-accumulation operation unit includes a multiplier performing a multiplication of data to be processed by said digital filter and a 0-th coefficient, and each said s-th ($1 \leq s \leq (n-1)$) multiply-accumulation operation unit includes, a multiplier performing a multiplication of said data and an i-th coefficient, a first selector having a first input end receiving an output of said (s-1)-th multiply-accumulation operation unit and a second input end, for selectively outputting signals applied to said first input end and said second input end according to a control signal, a first shift register transmitting an output of said first selector on the basis of a first clock signal, and an adder performing an addition of an output of said multiplier and an output of said first shift register and said adder outputting its result to a next stage, wherein said second input ends of said first selectors of said first to (n-1)-th multiply-accumulation operation units are connected in common and supplied with first test data, and a result of filtering processing to said data input is obtained from the output of said (n-1)-th multiply-accumulation operation unit.

11. The digital filter according to claim 10, wherein each said i-th ($0 \leq i \leq (n-1)$) multiply-accumulation operation unit further includes a second shift register applying said i-th coefficient to said multiplier and operating on the basis of a second clock signal, and each said s-th multiply-accumulation operation unit further includes a second selector having a first input end receiving an output of said second shift register of said (s-1)-th multiply-accumulation operation unit and a second input end, for selectively outputting signals applied to said first input end and said second input end according to said control signal, wherein said second input ends of said second selectors of said first to (n-1)-th multiply-accumulation operation units are connected in common and supplied with second test data.

12. The digital filter according to claim 11, which grasps outputs of said (n-1)-th multiply-accumulation operation unit collectively for every certain bits as output groups, wherein whether said digital filter is good or bad is determined according to agreement/disagreement of said output groups adjacently outputted.

* * * * *

UNITED STATES PATENT AND TRADEMARK OFFICE
CERTIFICATE OF CORRECTION

PATENT NO. : 5,790,439

DATED : August 4, 1998

INVENTOR(S) : Kazuya Yamanaka, et al

It is certified that error appears in the above-identified patent and that said Letters Patent is hereby corrected as shown below:

Column 15, line 34, delete "can".

Signed and Sealed this

Twenty-third Day of February, 1999

Attest:

Q. TODD DICKINSON

Attesting Officer

Acting Commissioner of Patents and Trademarks